US008717047B2

(12) United States Patent
Mueller (10) Patent No.: US 8,717,047 B2
(45) Date of Patent: May 6, 2014

(54) METHOD FOR MEASURING A CURRENT, IN PARTICULAR BY MEANS OF A GROUNDING APPARATUS

(75) Inventor: Burkard Mueller, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 144 days.

(21) Appl. No.: 13/439,250

(22) Filed: Apr. 4, 2012

(65) Prior Publication Data

US 2012/0200960 A1    Aug. 9, 2012

Related U.S. Application Data

(63) Continuation-in-part of application No. 12/543,167, filed on Aug. 18, 2009, now Pat. No. 8,169,226.

(30) Foreign Application Priority Data

Aug. 19, 2008    (EP) .................................... 08014666

(51) Int. Cl.
    *G01R 27/08*    (2006.01)
(52) U.S. Cl.
    USPC ......................................................... 324/713
(58) Field of Classification Search
    None
    See application file for complete search history.

(56) References Cited

U.S. PATENT DOCUMENTS

| 5,235,487 A | 8/1993 | Gruening |
| 5,498,984 A | 3/1996 | Schaffer |
| 6,300,772 B1 * | 10/2001 | Brown et al. ................. 324/555 |
| 6,917,235 B2 * | 7/2005 | Dupuy et al. ................. 327/333 |
| 6,924,649 B2 * | 8/2005 | Knoedgen ..................... 324/525 |
| 7,205,771 B2 * | 4/2007 | Berton .......................... 324/522 |
| 7,450,649 B2 * | 11/2008 | Gregorius et al. ............ 375/257 |
| 7,576,547 B2 | 8/2009 | Mueller |
| 7,924,582 B2 | 4/2011 | Mueller et al. |
| 8,098,058 B2 * | 1/2012 | Theil et al. ................... 323/277 |
| 2004/0263233 A1 | 12/2004 | Duppy et al. |
| 2007/0285102 A1 | 12/2007 | Muller |
| 2010/0045259 A1 | 2/2010 | Muller |
| 2011/0031813 A1 | 2/2011 | Falk |

FOREIGN PATENT DOCUMENTS

| DE | 19844465 A1 | 4/2000 |
| DE | 102006022686 A1 | 11/2007 |
| EP | 1857825 A1 | 11/2007 |

(Continued)

OTHER PUBLICATIONS

Notice of Allowance Dated Dec. 8, 2011 for U.S. Appl. No. 12/543,167. 19 Pages.

*Primary Examiner* — Melissa Koval
*Assistant Examiner* — Trung Nguyen
(74) *Attorney, Agent, or Firm* — Eschweiler & Associates, LLC (57) ABSTRACT

The invention is a method and electric circuitry for measuring a grounding current of a photovoltaic power system incorporating a photovoltaic inverter, a measurement current being led through two shunts disposed at different points. The measurement current is a current that may flow alternatively at two different points at different electric potentials, the current flowing at a potential that differs by at least 50 V from the potential of the point of evaluation. The shunts are inserted in such a manner in a current mirror circuit that the voltage drop caused by the measurement in the shunts generates an asymmetry in the current mirror the magnitude of which is proportional to the measurement current. The measurement current is the grounding current of the photovoltaic power system with optional positive or negative pole grounding.

8 Claims, 9 Drawing Sheets

(56) References Cited

FOREIGN PATENT DOCUMENTS

| | | | |
|---|---|---|---|
| FR | 2856856 | A1 | 12/2004 |
| GB | 2272300 | A | 5/1994 |
| JP | 56006508 | A | 1/1981 |
| JP | 11160368 | A | 6/1999 |
| WO | 03052433 | A2 | 6/2003 |

* cited by examiner

METHOD FOR MEASURING A CURRENT, IN PARTICULAR BY MEANS OF A GROUNDING APPARATUS

REFERENCE TO RELATED APPLICATIONS

This application is a continuation-in-part application of U.S. application Ser. No. 12/543,167, filed Aug. 18, 2009, that claims priority to European Patent Application No. 08014666.5, filed on Aug. 19, 2008, the contents both of which are incorporated by reference in their entirety.

FIELD

The invention relates to a method to measure the current through a ground-fault fuse and/or a grounding connection element of a grounding apparatus of an inverter that is intended to feed the output of a direct voltage source into an alternating voltage mains.

The invention further relates to a circuit arrangement for carrying out said method.

BACKGROUND

What are referred to as shunt resistors are known for current measurement, said shunt resistors having narrow tolerated and temperature stable resistance values. The measurement current flows through these shunt resistors so that a voltage, which is proportional to the current, can be measured at the resistance. This voltage can be fed to the evaluation unit, e.g., a microcontroller, through an amplifier of the evaluation unit. In order to keep the ohmic losses in the shunt resistor low, the resistance value of shunt resistors is kept very low, in particular below 1 ohm. As a result, the voltage at the shunt resistor is also low, e.g., some mV. This low measurement voltage becomes a problem if the current measurement occurs at a potential that differs significantly e.g., by more than 50 V, from that of the evaluation unit. In this case, simple differential amplifiers have a common mode fault that would strongly falsify the measurement voltage. As a result, expensive special component parts, e.g., that are referred to as instrumentation amplifiers, must be utilized.

Instrumentation amplifiers may be obviated if the measurement current does not flow directly through the shunt resistor but instead through a current transformer so that the shunt can be set to the potential of the evaluation unit. This solution however is only possible for pure alternating currents.

If direct currents are also to be measured, current converters are often utilized, that evaluate the magnetic field generated by the measurement current, e.g., with a Hall sensor. Such type current converters are very expensive.

It is known to let a current, that is proportional to the measurement current, flow from the point of measurement to the point of evaluation, e.g., to the processor. Integrated circuits for measuring the current, that work according to this principle, are available. Generally, these circuits only measure one current direction so that two ICs are needed to measure currents the algebraic sign of which is unknown. These measurement electronics moreover need a current supply at the potential of the point of measurement, that may be considerably different from the potential at the point of evaluation. As a result, measurement is difficult.

On photovoltaic inverters in photovoltaic power systems with photovoltaic generators, an additional short-to-ground may occur in the event of a fault. In case of such a short-to-ground, a current flows through the grounding apparatus. This current must be detected if one wants to eliminate this short-to-ground condition.

A known method consists in measuring the current via a current converter. These converters are expensive though. Moreover, they comprise quite high an offset that leads to measurement problems.

On photovoltaic power systems, one also encounters the problem that the generator may be grounded e.g., at the positive pole while the processor or the signalling control system (SCS) of the inverter are connected to the negative pole of the generator. As a result, the potential of the point of evaluation may differ significantly, e.g., by some 100 volt, from the potential of the point at which the grounding current is measured.

Another difficulty is that there are different photovoltaic modules that require different grounding variants for best operation. On some commercially available modules, it is advisable to ground the generator at the positive pole while on others it is provided to ground the generator at the negative pole. A current to be measured can thus flow at two different points of a power system. This problem has been solved hitherto by the fact that a separate measurement channel, for example of a microprocessor, is provided for each point. As a result, it is necessary to constantly sample several channels if it is not known at which point a current flows.

It is also known to measure an insulation resistance $R_{iso}$ on ungrounded photovoltaic power systems. Such a method is known from DE 10 2006 022 686 A1 for example.

The document EP 1 857 825 A describes a measurement arrangement for a photovoltaic power system with an inverter. In order to determine an insulation resistance $R_{iso}$, one uses two resistors Rs and two switches. If one of the switches is closed, the voltage is measured above the respective resistor Rs. A grounding current flows through the insulation resistance $R_{iso}$. In order to measure insulation faults both between the positive pole and ground and between the negative pole and ground, which may occur at the same time, a resistor, i.e., two resistors in all, are utilized at different points.

The principle of a current mirror circuit is also known.

A current mirror circuit is known from FR 2 856 856 A. It serves for a measurement method for a battery charger.

The document GB 2 272 300 A teaches to utilize one single shunt with a current mirror circuit incorporating two transistors. This circuit serves to measure a small voltage drop in the event of a much higher supply voltage.

Another current mirror circuit is known from the document WO 03/052433 A, said circuit also being provided with one single shunt. The circuit is intended to comprise an offset setting means that is provided for imposing an offset of the output voltage.

Another mirror circuit is shown and described in U.S. Pat. No. 5,498,984. This circuit has an operational amplifier and a shunt. In this solution, a current may flow on either side when the voltage is supplied by a battery.

A current mirror circuit is also known from DE 198 44 465 A. Therein it is defined that a current mirror circuit consists of a reference branch with a semiconductor and a mirror branch. The document JP 11160368 also discloses a mirror circuit with semiconductors.

A current mirror circuit for measuring a grounding fault on an amplifier is known from JP 56 006508 A. The circuit incorporates four transistors and two shunts at different points.

SUMMARY

One embodiment of the invention allows for a simple and low-cost measurement of a current even if the point of measurement is at a potential that significantly differs from the potential of the point of evaluation. More specifically, a method of the type mentioned is looked for by means of which a grounding current can be measured at little expense in photovoltaic power systems.

Transistors, the emitter terminals of which are respectively connected to the terminals of the shunt, either directly or via the same resistors, are utilized as semiconductors in one embodiment. Since the base terminals—as they are usual in current mirrors—are joined together, a voltage drop at the shunt directly leads to different voltages at the base emitter paths or at the emitter resistors and as a result thereof to an asymmetry in the current mirror.

The invention relies on the observation that the actually known principle of the current mirror is ideal for measuring a current at a potential that significantly differs from the potential of the evaluation unit and that it offers surprising advantages. As a result, it is also particularly well suited for measuring the grounding current in photovoltaic power systems.

A simple measurement of a current in two directions at a potential, that differs significantly from that of the point of evaluation, is possible thanks to the invention, without having to provide an operating voltage at the potential of the point of measurement.

According to one embodiment of the invention, a current is measured that can flow alternatively at two points without having to switch a measurement channel of an evaluation unit. This is advantageous if a photovoltaic power system is equipped optionally with a positive pole grounding or with negative pole grounding. This is made possible by having two of the arrangements described, that comprise a current mirror and a shunt, connected to each other, i.e., that they are connected together at the collector terminals of the transistors and that the measurement signal is tapped at this point.

Thanks to a developed implementation of the invention it is possible to determine the insulation condition of an electric plant or of an apparatus at little expense. On the one side, the current is measured in one embodiment above the grounding apparatus, such as a fuse, on grounding power systems or equipment and on the other side, the insulation resistance is determined on ungrounded power systems or equipments. For this purpose, the circuit of the invention is extended in such a manner that it allows for a measurement according to the principle of the document DE 10 2006 022 686 A1.

Accordingly, and in accordance with one embodiment of the invention, two shunt resistors are used, through which the measurement current flows. The voltage drop at the shunt puts a current mirror, for example with emitter resistors, out of tune so that said current mirror exhibits an asymmetry. This asymmetry is proportional to the measurement current and is evaluated at the potential of an evaluation unit, in particular of the signalling and control system of an inverter, such as with an operational amplifier circuit. Since the two semiconductor elements, in particular transistors, are subjected to bias voltage, the voltage drop at the shunt can be significantly lower than the base emitter voltage of the transistors. Since temperature changes have the same effect on both transistors, because they are, in one embodiment, thermally coupled, the asymmetry is preserved so that the circuit is very stable with respect to temperature.

If one wants to measure a current alternatively at two different potentials, two of the current mirror circuits are combined by connecting the two current mirrors to each other. The evaluation may for example occur via an operational amplifier circuit if the asymmetry is decoupled via two transistors with an anti-parallel base emitter path.

On equipment or power systems, that are operated optionally grounded or ungrounded, one may use a developed implementation of the circuit used with the two shunts, either to measure the ground current or the insulation. The current mirror may be advantageously used as the current source to measure the insulation or the resistance $R_{Iso}$.

The invention relies on the idea to provide a measurement arrangement configured to determine a current flowing at a potential that differs strongly, i.e., by more than 50 volt, from the potential of the point of evaluation. The measurement current is led through the shunt the two terminals of which are connected respectively, directly or through the same resistors, to the emitter terminal or the source terminal of two transistors. The two base or gate terminals of the two transistors are connected together and to a suited bias voltage, so that the difference between the two collector or drain currents are determined at the potential of the evaluation unit.

A particular advantage is obtained if the measurement array is utilized at little additional expense also to determine an insulation resistor of a power generating system or of an equipment connectable therewith, in particular of an inverter. Such a measurement permits detection of insulation faults in time.

Optimally, the method of the invention is utilized in one embodiment if the potential of the point of measurement is different from the potential of the point of evaluation. In practice, some 100 volt difference may exist, e.g., if a grounding current is measured at the positive pole of a photovoltaic generator, while the evaluation electronics has a potential reference to the negative pole of the generator. The method is already of benefit if the potential of the point of measurement differs from a potential of the point of evaluation by at least 50 volts.

The principle of the current mirror is utilized for the invention. For the collector or drain current of two transistors is the same if their base or gate terminals are connected and if the emitter or source terminals are connected to ground either directly or via the same resistors and if the two transistors are thermally coupled. Such a principle has proved efficient for example to suppress common mode operation on operational amplifiers.

For a current measurement, a shunt is practically inserted into the current mirror, i.e., the two terminals of the shunt are connected to an emitter or source terminal of a transistor via the same resistor, the two base or gate terminals of the transistors being joined together and connected to a bias voltage, a difference between the collector or drain currents being determined.

It is advantageous if the difference between the collector or drain currents is determined at the potential of an evaluation unit. For example, the grounding current can be determined on a positive-pole grounded photovoltaic generator by inserting a shunt with the described measurement device into the positive line, while the collector or drain terminals are connected to the negative line through resistors. If the value of these resistors is chosen such that the collector or drain currents impress therein voltages, that are substantially lower than the generator voltage and are rather in the measurement range of an evaluation unit such as a microprocessor, the measurement information is transferred from one potential to another in an elegant way without the need for a magnetic current converter, optocoupler or the like.

If the measurement current is a grounding current of a photovoltaic plant with optional positive or negative pole grounding, the invention can be used with two current mirrors connected to each other with the measurement current being allowed to flow alternatively at two different points.

Through an evaluation via an operational amplifier, a high measurement sensitivity is achieved in one embodiment so that very small short-to-ground currents can be measured.

BRIEF DESCRIPTION OF THE DRAWINGS

An exemplary embodiment will be explained in closer detail with respect to the drawings, other advantageous developed implementations of the invention and advantages thereof being described.

DETAILED DESCRIPTION

Figure 1:
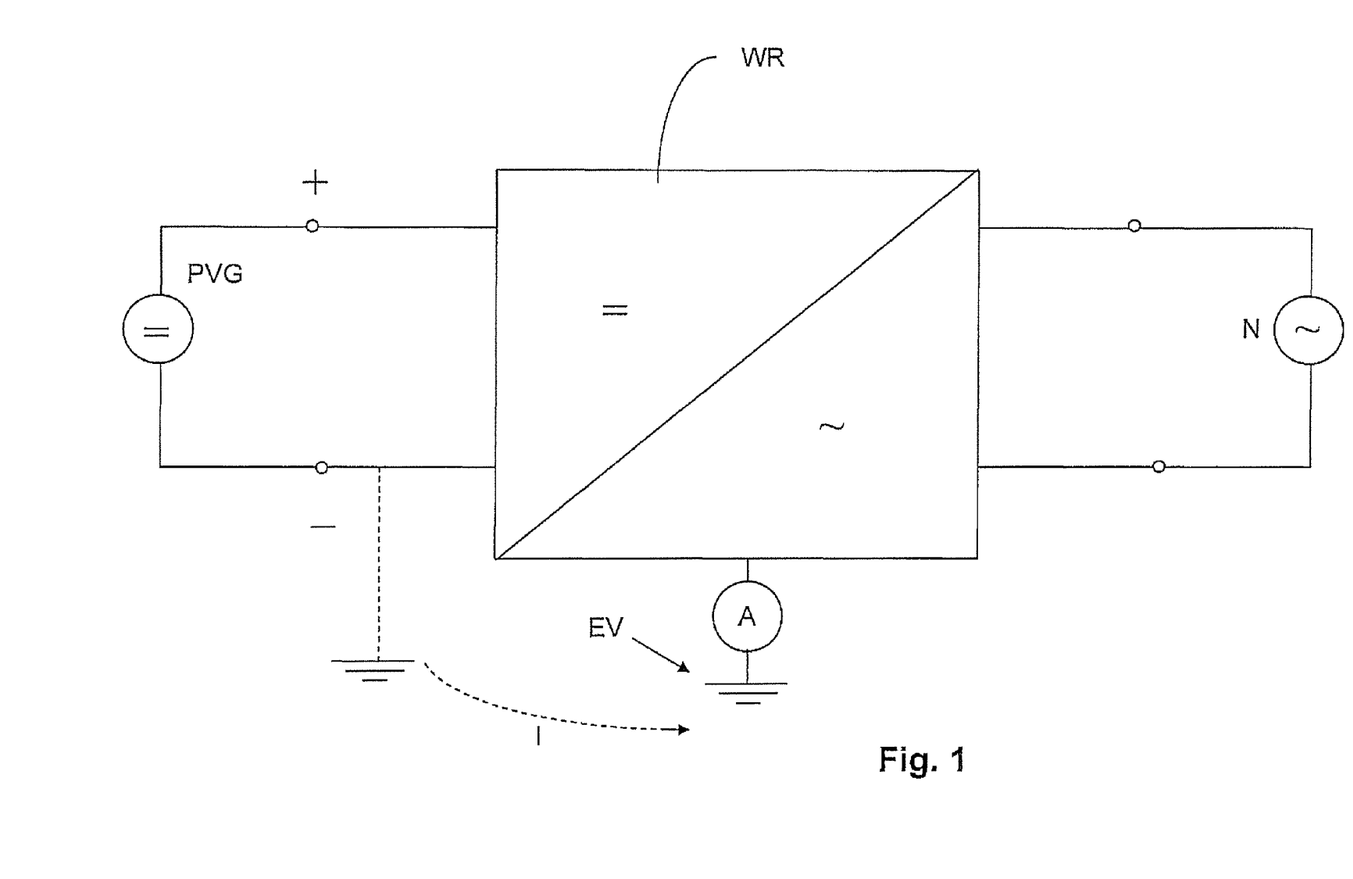
FIG. 1 shows a photovoltaic plant.

FIG. 1 shows an inverter WR for feeding an output of a direct voltage source, in particular of a photovoltaic generator PVG, into an alternating voltage mains N. The photovoltaic generator PVG incorporates photovoltaic modules made from amorphous or crystalline cells. These modules may require positive pole or negative pole grounding of the photovoltaic generator. In the example shown, the generator is associated to ground with its negative pole. The alternating voltage mains N can be a power supply grid or an isolated network.

The inverter is connected to ground through a grounding device EV.

As outlined by the dashed line in FIG. 1, an additional short-to-ground may exist at the negative pole of the generator PVG. As a result, a current I can flow from the additional short-to-ground through ground to the grounding apparatus EV. This current flows through the grounding apparatus EV, and this is the current to be measured, this being illustrated schematically by a current meter. Grounding must not occur through the inverter WR. Another grounding point may also exist.

The following method serves to measure the current I flowing through the short-to-ground fuse element of the grounding device EV and the grounding connection element in the grounded inverter for feeding the output of the generator PVG into the mains N.

Figure 2A:
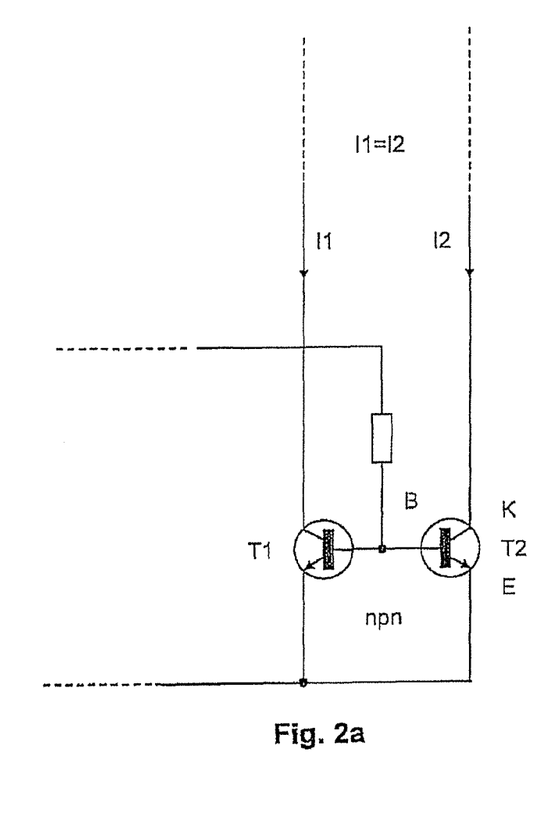
FIG. 2a shows a circuit according to the principle of a current mirror.

FIG. 2a serves to illustrate a principle of a current mirror. A pair of energizable semiconductor elements, in particular transistors T1, T2 are connected together at their base, both transistors T1, T2 being of the same type and thermally coupled. Thus, both receive the same control signal. Each emitter terminal has the same potential. The same collector current I1=I2 flows in both transistors.

Figure 2B:
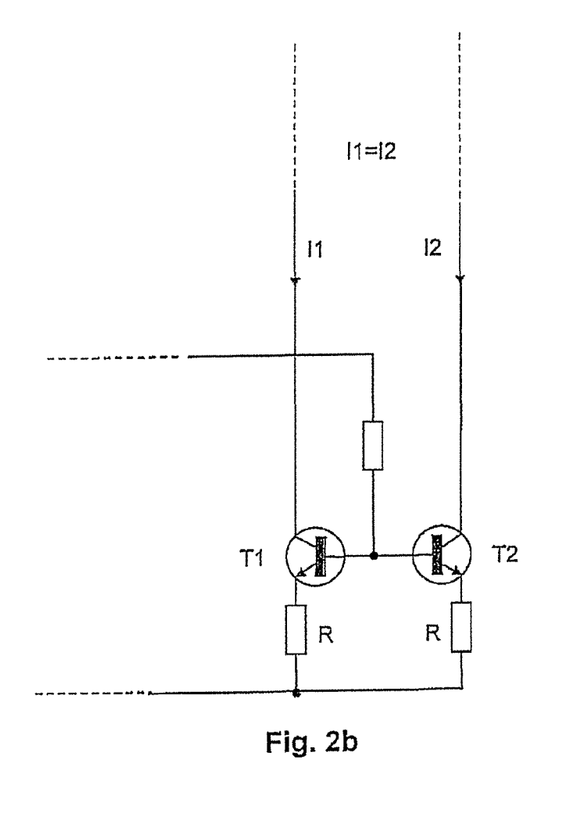
FIG. 2b shows the circuit shown in FIG. 2a, but with emitter resistors.

As shown in FIG. 2b, this also applies if a resistor R of the same value is connected in series to a respective one of the transistors, here e.g., two npn transistors. This circuit is always symmetrical.

Figure 3:
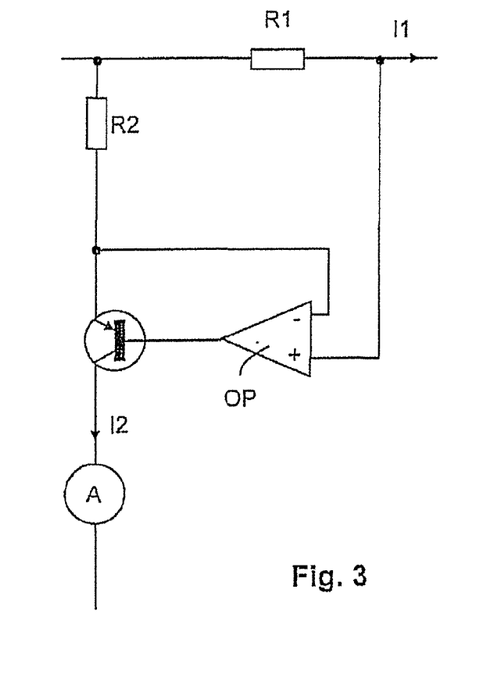
FIG. 3 shows an operational amplifier circuit with a measurement shunt.

With an operational amplifier OP and a shunt R1, a current flowing through the shunt R1 can be measured in principle at a current meter, as shown in FIG. 3. The resistor R2 is connected in series with the transistor. The following applies: I1×R1=I2×R2. The current I2 flowing through the transistor is proportional to the current I1. The following applies: I2=I1 (R1/R2). The disadvantage of this known circuit is that such a circuit must be built for each current direction. This measurement electronics additionally needs a current supply at the potential of the point of measurement.

Figure 4A:
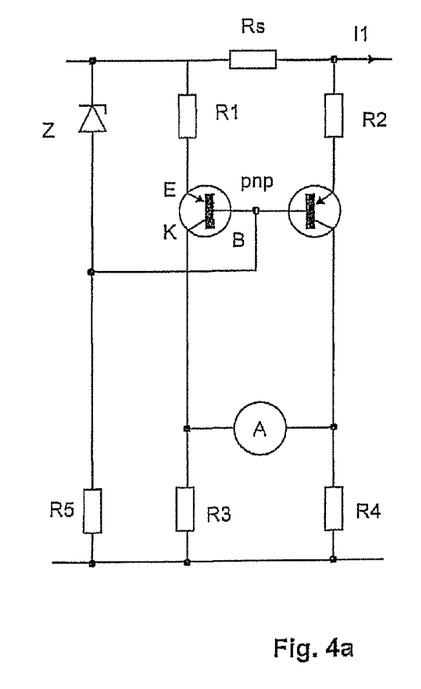
FIG. 4a shows a circuit for current measurement.

Hence, measurement is performed with the circuit of the invention as shown in FIG. 4a, in which the measurement current impresses a voltage in a shunt Rs, thus causing an asymmetry in a current mirror as shown in FIG. 2a or 2b. The measurement circuit incorporates two transistors T1, T2, here e.g., two pnp-transistors with two resistors R1=R2 connected between emitter and the shunt Rs. A resistor R3=R4 is connected to each collector. A current meter is interposed between the two collector resistors R3, R4. To generate a bias voltage for the current mirror, a zener diode Z and a fifth resistor R5 are used.

The measurement method relies on the fact that the measurement current is led through the shunt Rs in order to cause an asymmetry in the current mirror as illustrated in FIG. 4a, with at least two energizable semiconductor component parts T1, T2 connected to the shunt Rs so that a voltage difference occurs at the semiconductor component parts T1, T2 or at their collector resistors, the magnitude of which is proportional to the measurement current I1.

Figure 4B:
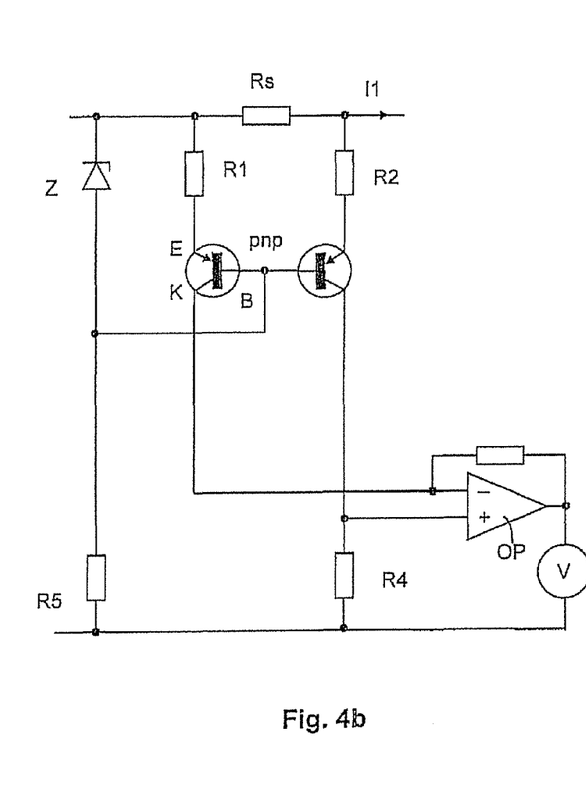
FIG. 4b shows an extension of the circuit shown in FIG. 4a with an operational amplifier circuit.

FIG. 4b shows an extension of the circuit shown in FIG. 4a in which the asymmetry is evaluated with the help of an operational amplifier circuit. A collector is hereby directly connected to the inverting operational amplifier input (−) while the other collector is connected to the non-inverting operational amplifier input (+). The operational amplifier is counter-coupled via the resistor R3 so that it works as the differential amplifier for the two collector currents of the current mirror. The output voltage applied at the operational amplifier OP is proportional to the current I1 and can be evaluated directly through an evaluation unit, in particular a microcontroller.

Figure 5A:
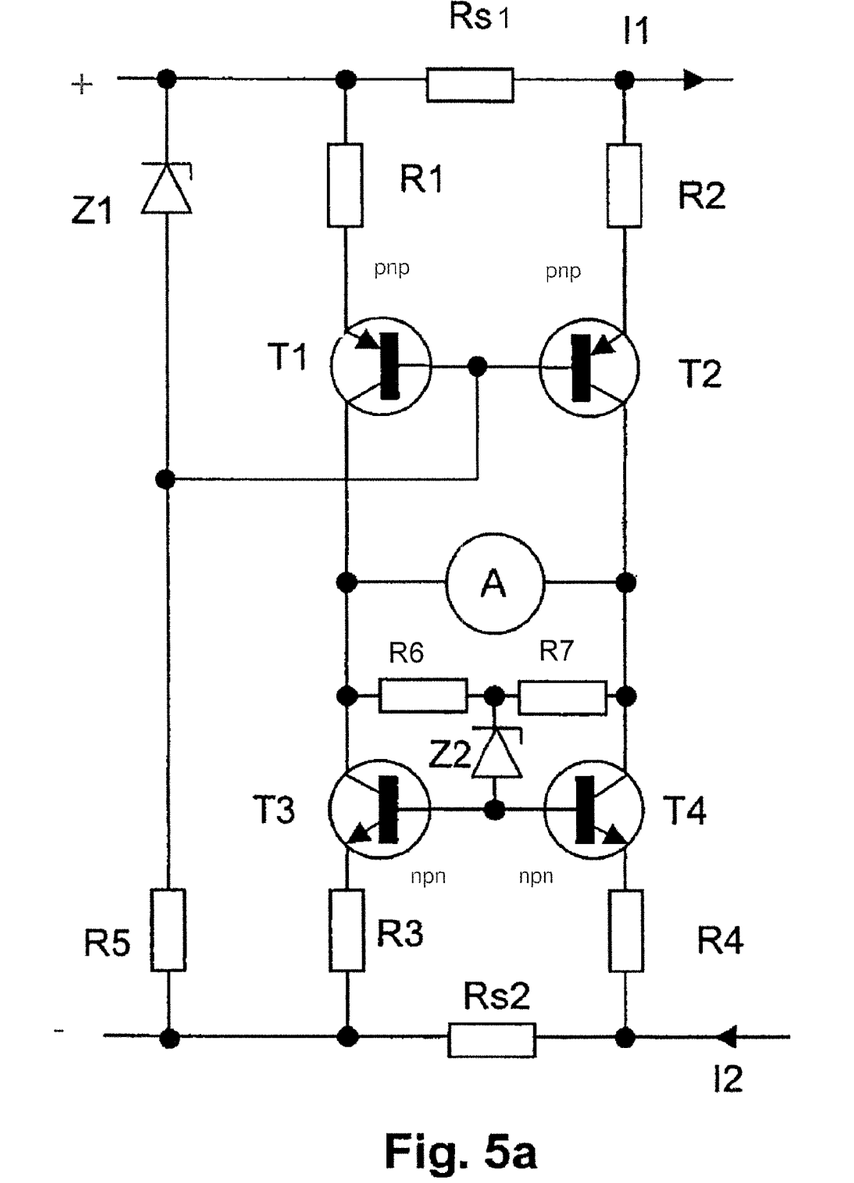
FIG. 5a shows a circuit of the invention as shown in FIG. 4a, but for alternative measurement of two currents I1 or I2 which flow at two different potentials.

FIG. 5a shows the principle of an alternative current measurement of the invention at two different potentials. Basically, two of the current mirror circuits are combined by connecting the two current mirrors to each other. In all, the circuit incorporates four transistors T1 through T4. The upper pnp transistors T1, T2 form a first pair of transistors to which a first shunt Rs1 is associated at a current path with I1. The lower pnp-transistors T3, T4 form a second pair of transistors to which a second shunt Rs2 is associated at the other current path with I2. To generate the bias voltage, the bases of the two lower transistors T3, T4 are connected together and to the anode of a second Z diode Z2 the cathode of which is connected through the same resistors to the collectors of the transistors T3 and T4. The first zener diode Z1 is connected analogous to FIG. 4a.

Figure 5B:
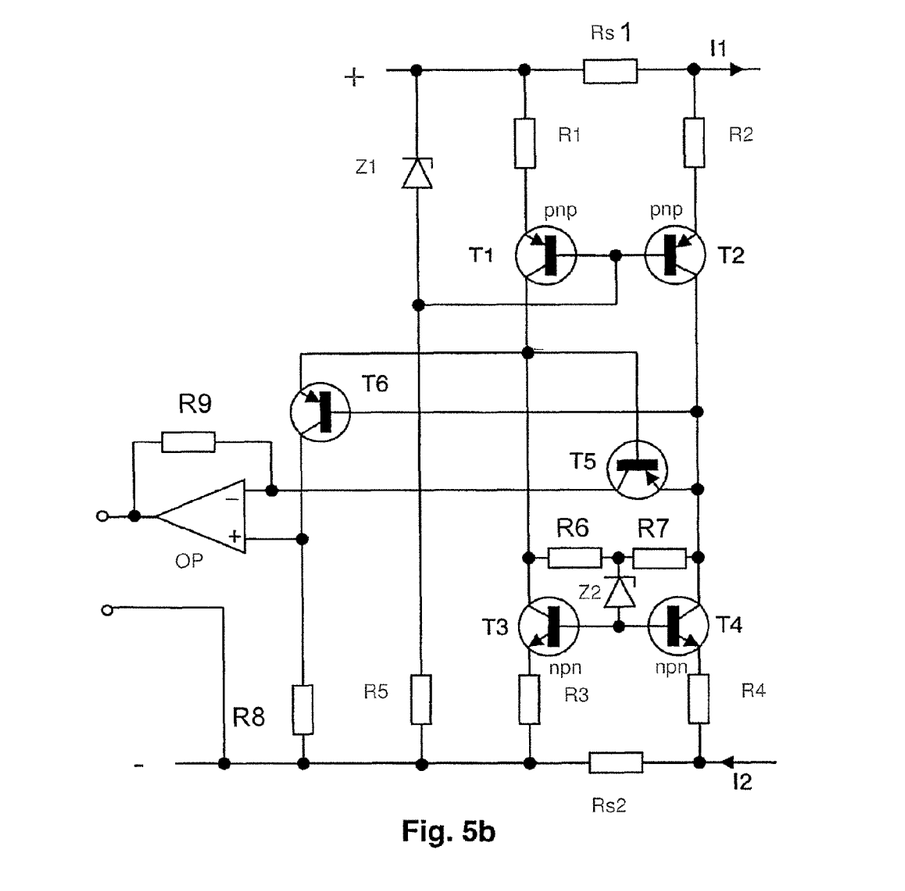
FIG. 5b shows an extension of the circuit shown in FIG. 5a with an operational amplifier circuit and FIG. 6 shows an extension of the circuit shown in FIG. 5b for use in a photovoltaic power system with the additional possibility of measuring an insulation resistor.

As shown in FIG. 5b, an evaluation may also occur through an operational amplifier circuit OP. The operational amplifier inputs are connected to the measurement circuit through additional transistors T5 and T6 or through transistor circuits, as shown therein. In a similar manner to that illustrated in FIG. 4b, the voltage difference caused by the current I1 through the shunt resistor Rs, is detected through the transistors T5 and T6, and the operational amplifier OP, via resistor R9, operates as a difference amplifier. Thus the voltage at the output of the operational amplifier OP reflects the value of the current I1 passing through the shunt resistor Rs.

Figure 6:
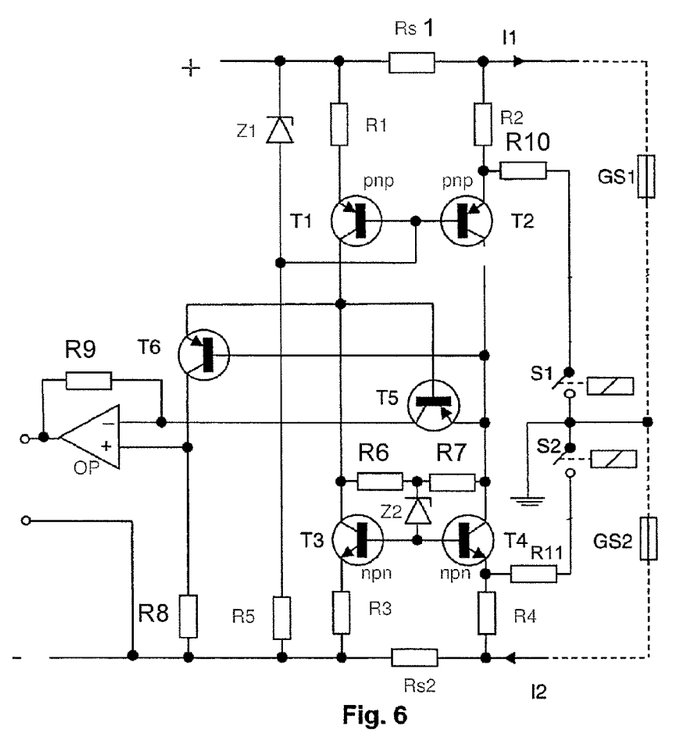

The circuit shown in FIG. 6 permits one to additionally measure an insulation resistor of the power generation system or of an apparatus connectable therewith or of the inverter WR. The power system is either grounded through the grounding device GS1 at the positive pole or through the grounding device GS2 at the negative pole or it is operated in an ungrounded condition. The grounding apparatus are shown as fuses by way of example, as often used. In the case of positive pole grounding, the grounding current corresponds to the current I1 and is sensed through the current mirror from T1 and T2. In case of negative pole grounding, the grounding current corresponds to the current I2 and is sensed through the current mirror from T3 and T4. If the power system is operated in an ungrounded condition the insulation resistance can be determined by means of the circuit. In a known way, two switches, preferably relay switches S1, S2 serve to perform several measurements in order to determine the resistance $R_{iso}$ at any point in the event of shorts-to-ground. Such a method is known from DE 10 2006 022 686 A1 and needs not be discussed in closer detail. The current mirror is here used as the current source for the insulation measurement or for the measurement of the resistor $R_{iso}$. Since, just like the currents I1 and I2, the currents through the switches S1 and S2 cause an asymmetry in the current mirrors, they may be determined through the operational amplifier or through an evaluation unit connected thereto. The circuit shown in FIG. 6 makes it possible to sense a grounding current optionally at the positive or at the negative pole as well as to determine the insulation resistance with only one measurement channel.

The invention claimed is:

1. An electric circuitry, comprising
an inverter configured to feed an output of a photovoltaic generator into an alternating voltage mains;
a grounding device configured to ground the photovoltaic generator at a positive pole or at a negative pole thereof when the photovoltaic generator is coupled to the inverter;
a first shunt through which a first current flows in case of a short-to-ground when the photovoltaic generator is grounded at the positive pole;
a second shunt through which a second current flows in case of a short-to-ground when the photovoltaic generator is grounded at the negative pole;
wherein the first shunt and the second shunt reside in a first current mirror circuit and a second current mirror circuit, respectively, each of the first current mirror circuit and the second current mirror circuit comprising a first transistor connected to a first terminal of the respective first shunt and second shunt through a first series-connected resistor, and a second transistor connected to a second terminal of the respective first shunt and second shunt through a second series-connected resistor which has the same resistance as the first series-connected resistor, and wherein the first current mirror circuit and the second current mirrors circuit are connected to each other at a point of evaluation;
wherein a voltage drop caused in the respective first shunt and second shunt by the respective first current and second current flowing in case of a short-to-ground generates an asymmetry in the respective first mirror circuit and second current mirror circuit, a magnitude of which is proportional to the respective first current and second current flowing through the respective first shunt and second shunt, and
wherein the asymmetry is evaluated at the point of evaluation at which the first current mirror circuit and second current mirror circuit are connected to each other, wherein a potential at the point of evaluation differs from a potential at which the current flows through the respective first shunt and second shunt in case of a short-to-ground.

2. The circuitry as set forth in claim 1,
wherein the first transistor and the second transistor of the first current mirror circuit and the second current mirror circuit, respectively, are of a same polarity type,
wherein emitter terminals of the first transistor and the second transistor of the first current mirror circuit and the second current mirror circuit, respectively, are connected to the respective first terminal and second terminal of the respective first shunt and second shunt, wherein base terminals of the first transistor and the second transistor are connected together and to a bias voltage,
wherein a collector terminal of the respective first transistor and the second transistor of the first current mirror circuit is connected to a collector terminal of the respective first transistor and second transistor of the second current mirror circuit at a first connection point and a second connection point, respectively, and
wherein a differential current is determined between the first connection point and the second connection point and is evaluated by an evaluation unit.

3. The circuitry as set forth in claim 1,
wherein the first current mirror circuit and the second current mirror circuit are of a same polarity type,
wherein source terminals of the first transistors and the second transistors of the first current mirror circuit and the second current mirror circuit are connected respectively to the first terminal and the second terminal of the respective first shunt and second shunt, wherein gate terminals of the first transistor and the second transistor are connected together and to a bias voltage,
wherein a drain terminal of the respective first transistor and second transistor of the first current mirror circuit is connected to a drain terminal of the respective first transistor and second transistor of the second current mirror circuit at a first connection point and a second connection point, respectively, and
wherein a differential current is determined between the first connection point and the second connection point and is evaluated by an evaluation unit.

4. The circuitry as set forth in claim 2, further comprising two additional transistors, wherein the first connection point and the second connection point of the first current mirror circuit and the second current mirror circuit are connected by anti-parallel connected base-emitter paths of the two additional transistors, the collector currents of which are evaluated by the evaluation unit.

5. The circuitry as set forth in claim 4, wherein the evaluation unit comprises a single operational amplifier.

6. The circuitry as set forth in claim 2, further comprising at least one Zener diode connected to the connected base terminals of the first transistor and the second transistor of one of the first current mirror circuit and the second current mirror circuit to provide a bias voltage thereto.

7. The circuitry as set forth in claim 3, further comprising at least one Zener diode connected to the connected gate terminals of the first transistor and the second transistor of one of the first current mirror circuit and the second current mirror circuit to provide a bias voltage thereto.

8. The circuit arrangement as set forth in claim 1, further comprising two switching elements configured to selectively provide, directly or in series with a current-limiting element, a connection between ground and a terminal of one of the second transistors of a respective one of the first current mirror circuit and the second current mirror circuit, wherein an asymmetry is generated in one of the first current mirror circuit and the second current mirror circuit upon closure of one of the two switching elements, the asymmetry being evaluated by the evaluation unit, and wherein the two switching elements are configured to perform a measurement of an insulation resistance in conjunction with the evaluation unit.

\* \* \* \* \*